United States Patent
He

(10) Patent No.: US 12,408,261 B2
(45) Date of Patent: Sep. 2, 2025

(54) ISOLATION SLOTS FOR AN ANTENNA AND PRINTED CIRCUIT BOARD INTERFACE

(71) Applicant: Aptiv Technologies AG, Schaffhausen (CH)

(72) Inventor: Yuxiao He, Carmel, IN (US)

(73) Assignee: Aptiv Technologies AG, Schaffhausen (CH)

( * ) Notice: Subject to any disclaimer, the term of this patent is extended or adjusted under 35 U.S.C. 154(b) by 237 days.

(21) Appl. No.: 18/306,204

(22) Filed: Apr. 24, 2023

(65) Prior Publication Data

US 2024/0357732 A1    Oct. 24, 2024

(51) Int. Cl.
| H05K 1/02 | (2006.01) |
| G01S 13/02 | (2006.01) |
| H01Q 1/52 | (2006.01) |
| H01Q 13/10 | (2006.01) |
| H05K 1/05 | (2006.01) |
| H05K 11/02 | (2006.01) |

(52) U.S. Cl.
CPC .............. *H05K 1/024* (2013.01); *G01S 13/02* (2013.01); *H01Q 1/525* (2013.01); *H01Q 13/106* (2013.01); *H05K 1/05* (2013.01); *H05K 11/02* (2013.01); *G01S 2013/0236* (2013.01); *H05K 2201/093* (2013.01)

(58) Field of Classification Search
CPC ............ H05K 1/02; H05K 1/024; H05K 1/05; H05K 11/02; G01S 13/02; H01Q 1/525; H01Q 13/106
USPC ......................................................... 361/760
See application file for complete search history.

(56) References Cited

U.S. PATENT DOCUMENTS

| 5,977,924 A | 11/1999 | Takei et al. |
| 6,198,434 B1 | 3/2001 | Martek et al. |
| 6,583,760 B2 | 6/2003 | Martek et al. |
| 9,917,355 B1 | 3/2018 | Lee et al. |

(Continued)

FOREIGN PATENT DOCUMENTS

| CN | 106207457 B | 3/2019 |
| CN | 110098485 A | 8/2019 |
| WO | 2017091307 A1 | 6/2017 |

OTHER PUBLICATIONS

"Extended European Search Report", EP Application No. 21189771.5, Feb. 18, 2022, 9 pages.

(Continued)

*Primary Examiner* — Tremesha W Burns
(74) *Attorney, Agent, or Firm* — Harness, Dickey & Pierce, P.L.C.

(57) ABSTRACT

This document describes techniques and systems relating to isolation slots for an antenna and printed circuit board (PCB) interface of a radar system. For example, isolation slots may be etched on a metal surface layer of a PCB for a radar control module on each side of each transmission line (e.g., microstrip line) that forms an array of channels (e.g., transmit channels, receive channels). When the PCB and an antenna structure are mated, a gap exists along the mating plane in which energy leakage between the channels can occur. The isolation slots create a stop band for a certain range of frequencies of interest and may reduce this energy leakage even when the gap is uneven along the mating plane. The isolation slots may be relatively easy and inexpensive to manufacture. The gap along the mating plane is not required to be constant, further simplifying the manufacturing process.

20 Claims, 7 Drawing Sheets

(56) References Cited

U.S. PATENT DOCUMENTS

| | | |
|---|---|---|
| 11,196,153 B1 | 12/2021 | Shi |
| 2011/0187482 A1 | 8/2011 | Ohno et al. |
| 2013/0169505 A1 | 7/2013 | Shmuel |
| 2018/0026356 A1 | 1/2018 | Schmalenberg et al. |
| 2019/0006743 A1 | 1/2019 | Kirino et al. |
| 2019/0288366 A1 | 9/2019 | Kirino et al. |
| 2019/0326686 A1 | 10/2019 | Yurievich et al. |
| 2020/0349545 A1 | 11/2020 | Moshe et al. |

OTHER PUBLICATIONS

Al-Hasan, et al., "Millimeter-Wave EBG-Based Aperture-Coupled Dielectric Resonator Antenna", IEEE Transactions on Antennas and Propagation, vol. 61, No. 8, Aug. 2013, pp. 4354-4357.

Fan, et al., "Bandwidth Investigation on Half-Height Pin in Ridge Gap Waveguide", IEEE Transactions on Microwave Theory and Techniques, vol. 66, No. 1, Jan. 2018, pp. 100-108.

Kildal, et al., "Local Metamaterial-Based Waveguides in Gaps Between Parallel Metal Plates", IEEE Antennas and Wireless Propagation Letters, vol. 8, 2009, pp. 84-87.

Pucci, et al., "New Microstrip Gap Waveguide on Mushroom-Type EBG for Packaging of Microwave Components", IEEE Microwave and Wireless Components Letters, vol. 22, No. 3, Mar. 2012, pp. 129-131.

Rajo-Iglesias, et al., "Size Reduction of Mushroom-Type EBG Surfaces by Using Edge-Located Vias", IEEE Microwave and Wireless Components Letters, vol. 17, No. 9, Sep. 2007, pp. 670-672.

Sun, et al., "Gap Waveguide With Interdigital-Pin Bed of Nails for High-Frequency Applications", IEEE Transactions on Microwave Theory and Techniques, vol. 67, No. 7, Jul. 2019, pp. 2640-2648.

Extended European Search Report regarding Application No. 23193662.6, dated Feb. 21, 2024.

Attia Hussein et al: "60 GHz PRGW slot antenna array with small separation and low mutual coupling", Global Symposium on Millimeter-Waves (GSMM), IEEE, May 25, 2015 (May 25, 2015), pp. 1-3, XP033188686, DOI: 10.1109/GSMM.2015.7175446 [retrieved on Aug. 3, 2015].

"Saeidi Tale et al: ""High Gain Wide Band Flexible Leaky Wave MIMO Antenna for AiP Applications"", 2022 Workshop on Microwave Theory and Techniques in Wireless Communications (MTTW), IEEE, Oct. 5, 2022 (Oct. 5, 2022), pp. 90-94, XP034231024,DOI: 10.1109/MTTW56973.2022.9942584 [retrieved on Nov. 21, 2022] + I. Introduction II. Antenna design and configuration; p. 90-p. 92; figures 1, 2".

"Yang Xu et al: ""Isolation Enhancement in Patch Antenna Array With Fractal UC-EBG Structure and Cross Slot"" IEEE Antennas and Wireless Propagation Letters, vol. 16, Jan. 1, 2017 (Jan. 1, 2017), pp. 2175-2178, XP011657947, ISSN: 1536-1225, DOI: 10.1109/LAWP.2017.2703170 [retrieved on Jul. 31, 2017] + I. Introduction II. Design process A. Fractal UC-EBG; p. 2175-p. 2177; figures 1, 2".

ISOLATION SLOTS FOR AN ANTENNA AND PRINTED CIRCUIT BOARD INTERFACE

BACKGROUND

Modern millimeter-wave automotive radar hardware often includes a radar control module (RCM) situated on a printed circuit board and a separate antenna unit that is physically mated to the printed circuit board. In practice, once the printed circuit board and the antenna unit are mated, a small gap (e.g., 50 to 100 micron gap) may exist between the printed circuit board and the antenna. Additionally, due to manufacturing and assembly tolerances or bowing of the printed circuit board, the gap may vary across the mating plane between the printed circuit board and the antenna unit. This gap can allow energy leakage between transmit or receive channels that are adjacent to one another. The energy leakage can result in poor isolation or crosstalk between the channels, reducing the sensitivity of the radar system.

SUMMARY

This document describes techniques and systems of isolation slots for an antenna and printed circuit board (PCB) interface configured to provide isolation among radar channels. For example, a PCB comprises a metal layer and an array of transmission lines having at least one row of multiple columns, with each transmission line configured to transmit or receive electromagnetic (EM) energy. The metal layer comprises a waveguide interface opening for surrounding each transmission line in the array of transmission lines, each waveguide interface opening being a portion of the metal layer where the metal has been removed. The metal layer also includes multiple isolation slots, configured to form a stop band for a frequency band of the electromagnetic energy, an isolation slot being disposed on each side of each column in the array of transmission lines such that an isolation slot is aligned in the at least one row on each side of each waveguide interface opening, each isolation slot being a portion of the metal layer where the metal has been removed.

This document also describes methods performed by the above-summarized system and other methods set forth herein, as well as means for performing these methods.

This Summary introduces simplified concepts related to isolation slots for an antenna and printed circuit board interface, further described in the Detailed Description and Drawings. This Summary is not intended to identify essential features of the claimed subject matter, nor is it intended for use in determining the scope of the claimed subject matter. Although primarily described in the context of radar systems for automotive applications, the techniques for isolating channels of an electromagnetic sensor can be applied to other applications where sensitivity of a sensor system is required.

BRIEF DESCRIPTION OF THE DRAWINGS

The details of isolation slots for an antenna and printed circuit board interface are described in this document with reference to the Drawings that may use same numbers to reference like features and components, and hyphenated numbers to designate variations of these like features and components. The Drawings are organized as follows:

FIG. 1-2 illustrates an example RCM and an example antenna structure of a radar system with isolation slots for an antenna and PCB interface from which the portion was extracted, in accordance with techniques of this disclosure;

FIG. 2 illustrates a detailed example of an RCM portion of an RCM with isolation slots for an antenna and PCB interface, in accordance with techniques of this disclosure;

FIGS. 4-1 and 4-2 illustrate an example of the isolation of EM energy in the radar channels of the radar system 102 with isolation slots for an antenna and PCB interface, in accordance with techniques of this disclosure.

DETAILED DESCRIPTION

Overview

Figure 1:
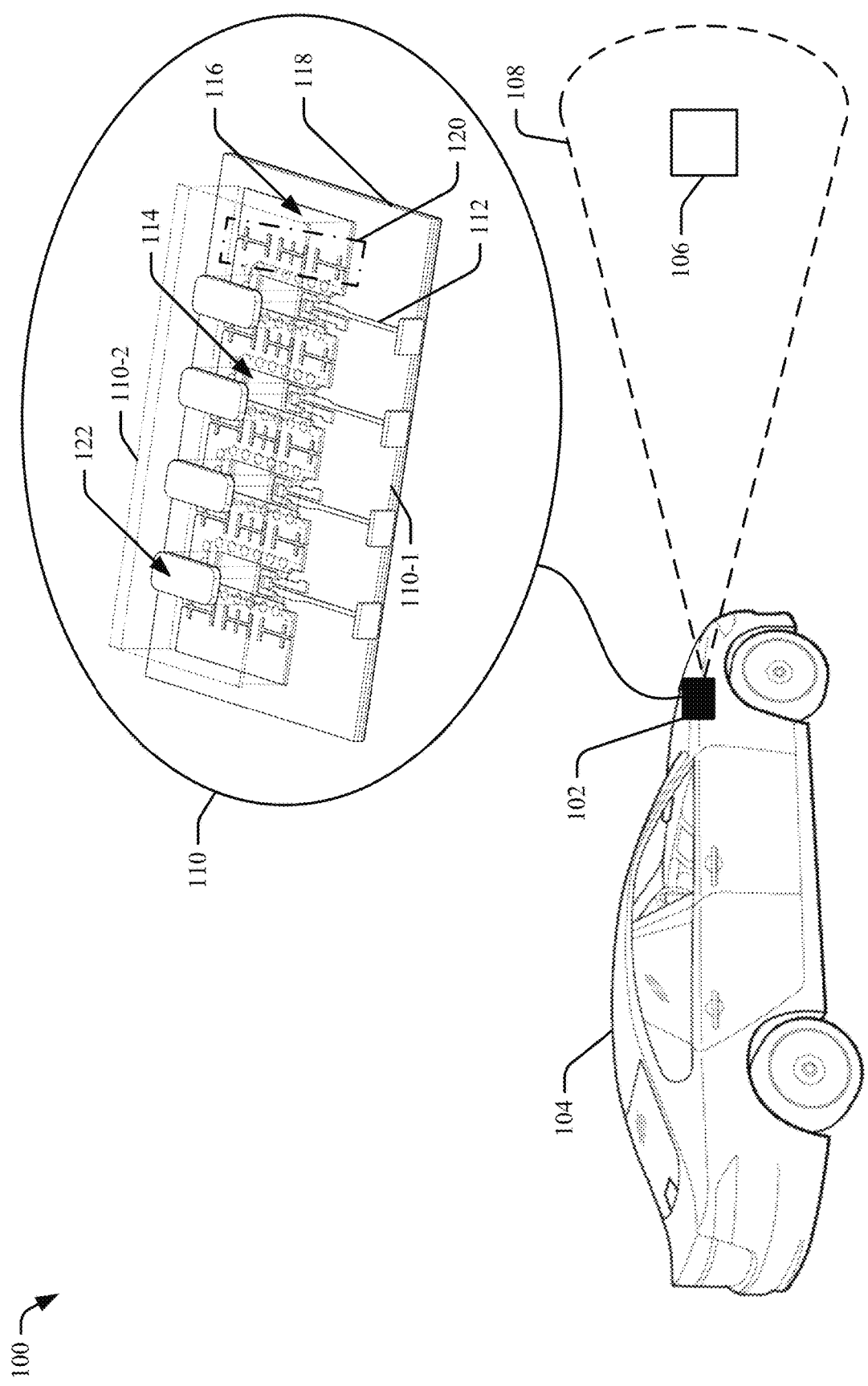
FIG. 1-1 illustrates an example environment in which a radar system with isolation slots for an antenna and PCB interface can be implemented, in accordance with techniques of this disclosure.
Figure 1:
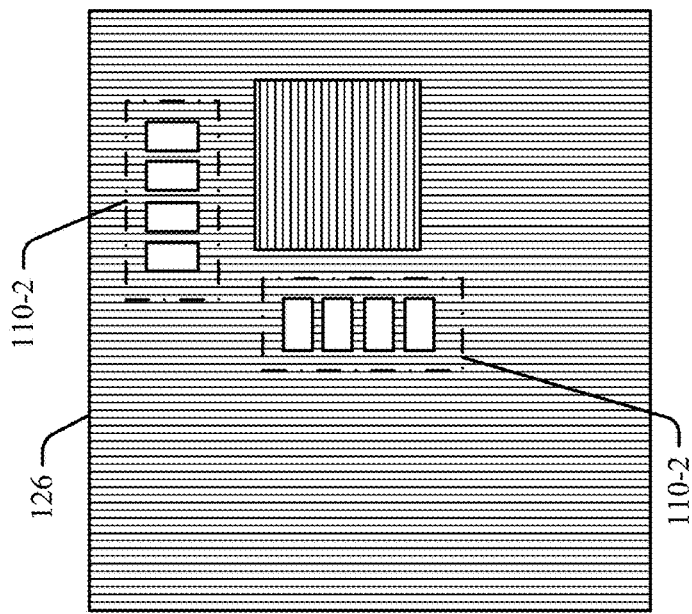

Many automotive systems rely on radar systems to acquire information related to the surrounding environment. Some radar systems include one or more arrays of channels (e.g., transmit channels, receive channels) on a PCB of an RCM that are configured to transmit or receive electromagnetic energy in the environment. An antenna structure, including waveguides positioned above the channels, may be used to direct beams of the electromagnetic energy being transmitted or received. Even with the antenna structure mated to the PCB, these channels may be susceptible to energy leakage (e.g., crosstalk) from the neighboring channels resulting in interference between the channels. One reason for this energy leakage is that a small gap between the PCB and the antenna structure may exist after the PCB and the antenna structure are mated. Variances inherent in the manufacturing of the antenna structure may lead to the gap being uneven across the interface (e.g., the mating plane). Further, in some cases, installation or environmental conditions may cause the PCB to bow leading to more variances across the mating plane.

Isolating the channels of a radar system to reduce the energy leakage is crucial to maintain adequate sensitivity of the radar system. Some approaches that attempt to isolate the channels include pin-gap structures and mushroom structures.

Pin-gap structures formed on the antenna structure (e.g., a pin-gap antenna structure, a pin-gap waveguide) utilize several rows of pins (e.g., small cylindrical structures) positioned to traverse the gap to form a metal fence, such that leaked energy will be reflected back into the respective channel (e.g., the respective channel waveguide). The size, stand-off distance, and arrangement of the pins are carefully designed given a specific interface gap distance.

Mushroom structures (e.g., electromagnetic bandgap (EBG) structures) are similar to the pin-gap antenna structures in principle. The mushroom structures utilize periodic unit elements to create a stop band for a range of frequencies, such that the energy carried by these frequencies are blocked. As opposed to the pin-gap structures, the mushroom structures are generally formed on the PCB by layers of dielectric material and conducting materials (e.g., metal). The specific shape and arrangement of the mushroom structures can be designed to configure the stop band characteristics, including center frequency, rejection level, and bandwidth.

Both of these approaches were originally proposed for lower operating frequencies than the operating frequencies (e.g., E-band, W-band) of vehicle-based millimeter wave radar systems. At these higher frequencies, the size of the pin structures or the mushroom structures becomes very small, increasing the manufacturing difficulty. To achieve the expected isolation performance, stringent manufacturing tolerances are required, further increasing manufacturing costs.

The pin-gap structures and the mushroom structures require a relatively large area, with the respect to the channels on the PCB, for periodically implementing a required number of structures to effectively create an isolation band, thus, increasing the overall package size of the system. The mushroom structures are generally fabricated from multiple PCB layers that can further increase the package size. These larger packages have higher material and manufacturing costs and less flexibility in system integration.

The pin-gap structures and the mushroom structures also function more efficiently with a constant gap having a low variation tolerance across the mating plane. Achieving a constant gap can be very difficult and expensive to maintain during the manufacturing process.

In contrast, this document describes techniques and systems relating to isolation slots for an antenna and PCB interface of a radar system. For example, isolation slots may be etched on a metal surface layer of a PCB for an RCM on each side of each transmission line (e.g., microstrip line) that forms an array of channels (e.g., transmit channels, receive channels). When the PCB and an antenna structure are mated, a gap exists along the mating plane in which energy leakage between the channels can occur. The isolation slots create a stop band for a certain range of frequencies of interest and may reduce this energy leakage even when the gap is uneven along the mating plane. The isolation slots may be relatively easy and inexpensive to manufacture. The gap along the mating plane is not required to be constant, further simplifying the manufacturing process.

Example Environment

FIG. 1-1 illustrates an example environment 100 in which a radar system 102 with isolation slots for an antenna and PCB interface can be implemented, in accordance with techniques of this disclosure. In the depicted environment 100, the radar system 102 is mounted to, or integrated within, a vehicle 104. The radar system 102 is capable of detecting one or more objects 106 that are in proximity to the vehicle 104. Although illustrated as a car, the vehicle 104 can represent other types of motorized vehicles (e.g., a motorcycle, a bus, a tractor, a semi-trailer truck, or construction equipment), non-motorized vehicles (e.g., a bicycle), railed vehicles (e.g., a train or a trolley car), watercraft (e.g., a boat or a ship), aircraft (e.g., an airplane or a helicopter), or spacecraft (e.g., satellite). In general, manufacturers can mount the radar system 102 to any moving platform, including moving machinery or robotic equipment.

In the depicted implementation, the radar system 102 is mounted on the front of the vehicle 104 and provides a field-of-view 108 illuminating the one or more objects 106. The radar system 102 can project the field-of-view 108 from any exterior surface of the vehicle 104. For example, vehicle manufacturers can integrate the radar system 102 into a bumper, side mirror, headlights, rear lights, or any other interior or exterior location where the object 106 requires detection. In some cases, the vehicle 104 includes multiple radar systems 102, such as a first radar system 102 and a second radar system 102 that together provide a larger field-of-view 108. In general, vehicle manufacturers can design the locations of the one or more radar systems 102 to provide a particular field-of-view 108 that encompasses a region of interest in which the object 106 may be present. Example fields-of-view 108 include a 360-degree field-of-view, one or more 180-degree fields-of-view, one or more 90-degree fields-of-view, and so forth, which can overlap or be combined into a field-of-view 108 of a particular size.

The object 106 is composed of one or more materials that reflect radar signals. Depending on the application, the object 106 can represent a target of interest. In some cases, the object 106 can be a moving object or a stationary object. The stationary objects can be continuous (e.g., a concrete barrier, a guard rail) or discontinuous (e.g., a traffic cone) along a portion of the road.

The radar system 102 emits electromagnetic radiation by transmitting one or more electromagnetic signals or waveforms via active elements. In the environment 100, the radar system 102 can detect and track the object 106 by transmitting and receiving one or more radar signals. As an example, the radar system 102 can transmit electromagnetic signals between 100 and 400 gigahertz (GHz), between 4 and 100 GHz, or between approximately 70 and 80 GHz.

The radar system 102 can determine a distance to the object 106 based on the time it takes for the signals to travel from the radar system 102 to the object 106, and from the object 106 back to the radar system 102. The radar system 102 can also determine a location of the object 106 in terms of an angle based on the direction of a maximum amplitude echo signal received by the radar system 102.

The radar system 102 can be part of the vehicle 104. The vehicle 104 can also include at least one automotive system that relies on data from the radar system 102, including a driver-assistance system, an autonomous-driving system, or a semi-autonomous-driving system. The radar system 102 can include an interface to the at least one automotive system. The radar system 102 can output, via the interface, a signal based on electromagnetic energy received by the radar system 102.

Generally, the automotive systems use radar data provided by the radar system 102 to perform a function. For example, the driver-assistance system can provide blind-spot monitoring and generate an alert that indicates a potential collision with the object 106 that is detected by the radar system 102. In this case, the radar data from the radar system 102 indicates when it is safe or unsafe to change lanes. The autonomous-driving system may move the vehicle 104 to a particular location on the road while avoiding collisions with the object 106 detected by the radar system 102. The radar data provided by the radar system 102 can provide information about a distance to and the location of the object 106 to enable the autonomous-driving system to perform emergency braking, perform a lane change, or adjust the speed of the vehicle 104.

The radar system 102 includes an RCM and an antenna structure of which a portion 110 of each is illustrated in FIG. 1-1. The portion 110 includes an RCM portion 110-1 and an antenna structure portion 110-2. When the RCM portion 110-1 and the antenna structure portion 110-2 are mated, a small gap (illustrated in FIG. 3) of up to a few hundred micrometers (μm) (e.g., 50 μm to 200 μm) may exist between the RCM portion 110-1 and the antenna structure portion 110-2. The RCM portion 110-1 includes one or more arrays of transmission lines 112 (e.g., microstrip lines associated with an array of transmit channels or receive channels). The antenna structure portion 110-2 includes a respective waveguide channel 122 for each transmission line 112. A respective waveguide interface opening 114 for surrounding each of the transmission lines 112 in the array is etched into a top metal layer 116 of an RCM PCB 118. On each side of each waveguide interface opening 114 is an isolation slot 120. The small gap along the mating plane of the RCM portion 110-1 and the antenna structure portion 110-2 may allow EM energy to leak from a transmission line/waveguide channel combination to neighboring transmission line/waveguide channel combinations, and the isolation slots 120 are configured (e.g., tuned) to generate a stop band between each of the transmission line/waveguide channel combinations. That is, the isolation slots 120 essentially block a desired frequency band of EM energy from crossing between each transmission line/waveguide interface reducing interference between the transmit/receive channels.

Figure 2:
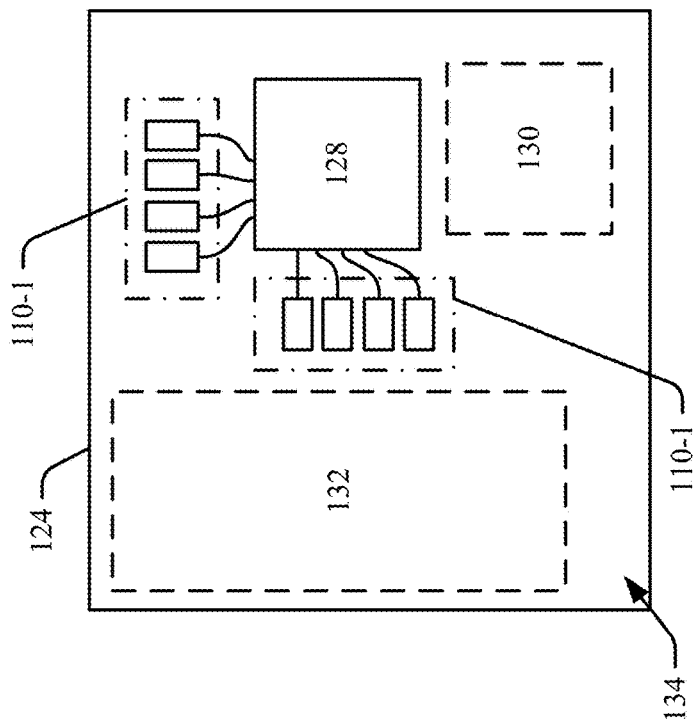
Figure 2:
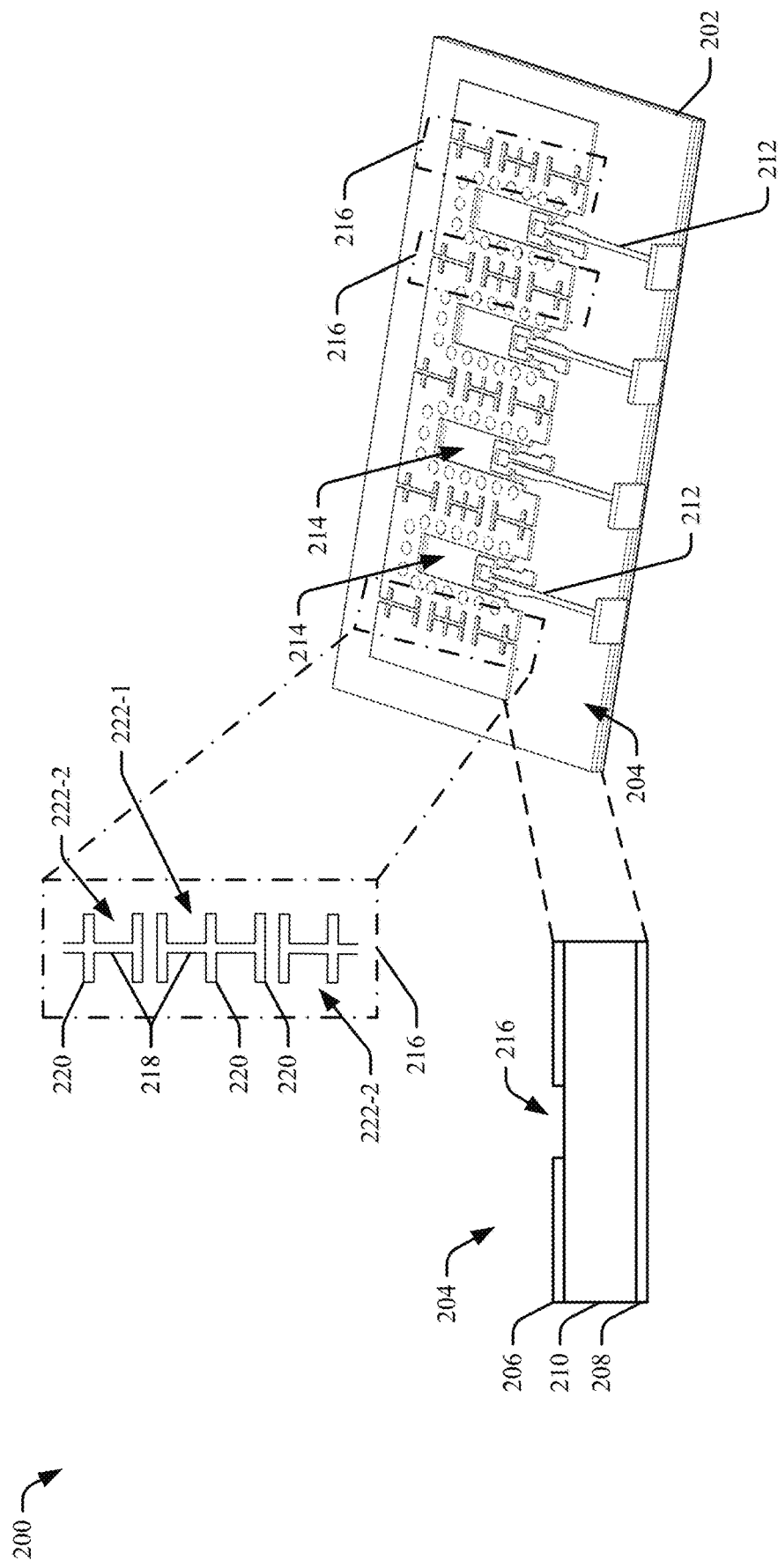

FIG. 1-2 illustrates an example RCM 124 and an example antenna structure 126 of a radar system with isolation slots for an antenna and PCB interface from which the portion 110 (e.g., portion 110-1 and portion 110-2, respectfully) was extracted, in accordance with techniques of this disclosure. The RCM 124 can include a monolithic microwave integrated circuit (MMIC) 128 electrically coupled to the transmission lines 112, one or more other processors 130, and other circuitry 132. The RCM 124 also includes one or more RCM portions 110-1. In this example two RCM portions 110-1 are illustrated. The RCM portions 110-1 each can include an array of transmission lines 112, the respective waveguide interface openings 114 for surrounding each transmission line 112, and the isolation slots 120 positioned between each transmission line 112, and on each end of the array of transmission lines 112. These components are arranged on a PCB 134.

The processor 130 can be implemented as a microprocessor or a system-on-chip. The processor 130 and/or the MMIC 128 executes instructions that are stored within a computer-readable storage media (CRM) that may be included in the circuitry 132 or reside external to the RCM 124. As an example, the processor 130 can process EM energy received by the transmission lines 112 and determine a location of the object 106 relative to the radar system 102. The processor 130 can also generate radar data for the automotive systems. As an example, the processor 130 can control, based on processed EM energy received by the RCM 124, an autonomous or semi-autonomous driving system of the vehicle 104.

The antenna structure 126 may be formed from metal or other conducting materials and includes antenna structure portions 110-2 configured to align with each respective RCM portion 110-1 when the antenna structure 126 is placed and mated over the RCM 124. The antenna structure portions 110-2 can be waveguides that radiate the EM energy to/from the RCM 124. The RCM 124 and the antenna structure 126 may be held together with fasteners, compression techniques, or other mating methods.

As previously described, a gap may be present across the mating plane of the RCM 124 and the antenna structure 126. Due to manufacturing tolerances or bowing of the PCB, the gap distance may be uneven across the mating plane. The isolation slots 120 may provide isolation between the channels even with these gap variations. That is, the isolation slots 120 may be much more tolerant to manufacturing imperfections than other approaches.

Example Architecture

FIG. 2 illustrates a detailed example 200 of an RCM portion 202 of an RCM with isolation slots for an antenna and PCB interface, in accordance with techniques of this disclosure. The RCM portion 202 is an example of the RCM portion 110-1 illustrated in FIG. 1. In this example, the RCM portion 202 is fabricated on a PCB 204. The PCB 204 may only require a first metal layer 206, a second metal layer 208 that acts as a ground plane, and a dielectric substrate layer 210 that is disposed in between the first metal layer 206 and the second metal layer 208 to implement the isolation slots for an antenna and PCB interface.

The first metal layer 206 includes the transmission lines 212, the waveguide interface openings 214, and the isolation slots 216. The transmission lines 212 are formed from the metal of the first metal layer 206. The waveguide interface openings 214 and the isolation slots 216 are portions of the first metal layer 206 where the metal has been removed (e.g., etched). In the example 200, four transmission lines 212 (e.g., a 1×4 array having one row and four columns), four waveguide interface openings 214, and five isolation slots 216 are illustrated. However, the number of transmission lines 212 and waveguide interface openings 214 may vary as long as there is one waveguide interface opening 214 for each transmission line 212. The isolation slots 216 can also vary such that there is one more isolation slot 216 than there is waveguide interface opening 214 (or transmission line 212) for a one-dimensional array of transmission lines 212. For a multi-dimensional array of transmission lines 212 (not illustrated), each row and each column of transmission lines 212 may have one more isolation slot 216 than the number of transmission line 212 such that each transmission line 212 is surrounded by an isolation slot 216 on all four side.

Each waveguide interface opening 214 encompasses a transmission line 212. The isolation slots 216 are disposed on each side of each transmission line 212 (or waveguide interface opening 214) along the row of the array of transmission lines 212. This results in an isolation slot 216 being positioned between each transmission line 212 and on each outer end of the row (e.g., the 1×4 array) of transmission lines 212.

The isolation slots 216 have a shape and dimensions configured (e.g., tuned) to block (e.g., filter) a certain frequency or frequency band. For example, the isolations slots may be configured to block a frequency band centered around 76.5 Gigahertz (GHz) or a frequency band from 72 GHz to 82 GHz. Depending on the application, the isolation slots 216 may filter other center frequencies or frequency bands. In some aspects, the isolation slots 216 are formed from one or more first branches 218 aligned in parallel with the longitudinal direction of the waveguide interface opening and one or more second branches 220 aligned orthogonal to the longitudinal direction of the waveguide interface opening. For example, three first branches 218 may be aligned end-to-end with a space between each first branch 218. The two outer first branches 218 may each bisect two second branches 220. The inner first branch 218 may bisect three second branches 220. Additionally, the first branches 218 and the second branches 220 may be arranged in isolation slot units 222. This configuration forms three isolation slot units 222 that, in aggregate, form an isolation slot 216. Other configurations of the first branches 218 and 220 may, likewise, be arranged to create different numbers of isolation slot units 222 within the isolation slot 216.

Specifically, the quantity, dimensions (e.g., length and width), and arrangement of first branches 218 and second branches 220 and the proximity of the isolation slot units 222 are tuned to block the desired frequencies. In some aspects, the length of each first branch 218 and second branch 220 may be tuned for a center frequency of the desired stop band. The length may near a quarter wavelength of the center frequency, but the length of each first branch 218 and second branch 220 can be lengthened or shortened to consider the effects of the dielectric substrate layer 210 and/or an air dielectric due to a gap formed once an antenna structure (e.g., the antenna structure 126) has been mated to the PCB 204. Their length and width may be near a quarter wavelength (e.g., $\lambda/4$) of the center frequency, but these dimensions can be adjusted depending on the desired frequencies to be blocked and the characteristics of the dielectrics being used. These desired frequencies may be the operating frequency or frequency band of the RCM.

Figure 3:
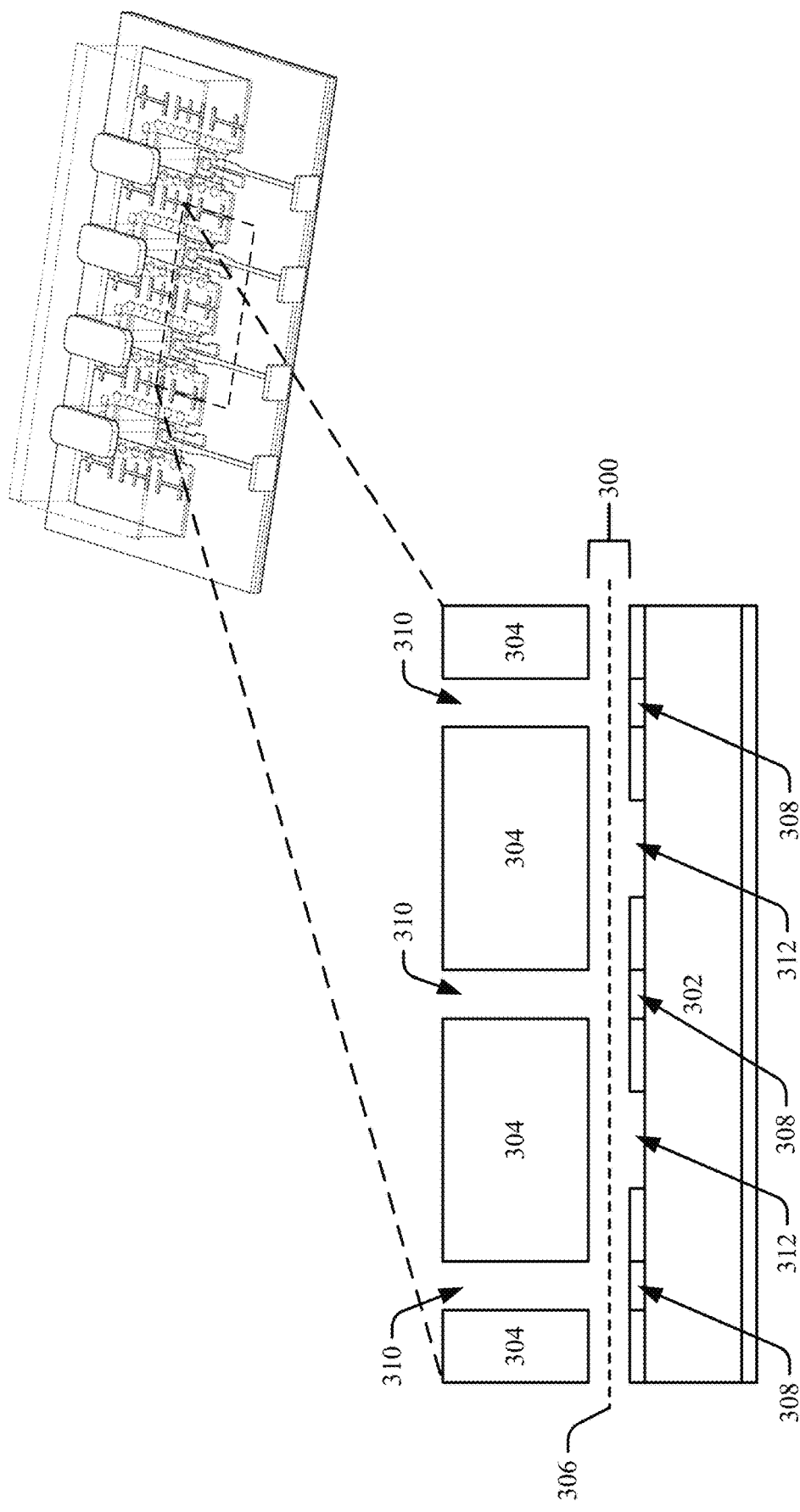
FIG. 3 illustrates an example gap between a PCB and an antenna structure for a radar system with isolation slots for an antenna and PCB interface, according to techniques of this disclosure.

In the example above, a stop band of approximately 72 GHz to 82 GHz with a center frequency of approximately 76.5 GHz (e.g., $\lambda/4 \approx 0.57$ mm, assuming the energy is mostly inside the dielectric) is desired. Additionally, dielectric substrate layer 210 has a dielectric constant of 3.74 and a thickness of 83 μm. The length of each first branch 218 and each second branch 220 is close to the quarter wavelength of the center frequency given a hybrid PCB-air media and determines the center of the stop band. In this example, the length of the first branch 218 is 0.53 mm and the length of the second branch 220 is 0.8 mm. The length of the second branch 220 is lengthened to be slightly longer than the quarter wavelength of the center frequency to accommodate the leaked energy that exists in both the dielectric substrate layer 210 and the air gap (e.g., the air gap 300 as illustrated in FIG. 3). The leaked energy causes the effective wavelength in this PCB-air hybrid media (due to a combined dielectric value of the dielectric substrate layer 210 and the air in the air gap) to be larger than in a single, pure dielectric material. The width of the first branches 218 and the second branches 220 may be approximately 0.1 mm to tune the stop band rejection level and the bandwidth. Additionally, each of the second branches 220 may have slightly different lengths and widths. That is, in this example, the isolation slots 216 are further tuned for the desired stop band characteristics by adjusting the lengths of the two end second branches 220 in the isolation slot units 222-1 to have a length of 0.75 mm and a width of 0.16 mm. In general, tuning the second branches 220 affects the performance of the isolation slots 216 more than tuning the first branches 218.

The isolation slots 216 are fabricated by removing metal from the first metal layer 206 in a manner similar to fabricating the waveguide interface openings 214. For example, the isolation slots 216 can be etched into the first metal layer 206 during the same traditional manufacturing process used to etch the waveguide interface openings 214 and without the need for extra tooling. Thus, no additional costs may be incurred during the fabrication of the isolation slots 216.

FIG. 3 illustrates an example gap 300 between a PCB 302 and an antenna structure 304 for the radar system 102 with isolation slots for an antenna and PCB interface, according to techniques of this disclosure. When the PCB 302 and the antenna structure 304 are mated along the mating plane 306, ideally no gap 300 would exist, but in practice, this is not the case. The gap 300 may be as much as a few hundred micrometers along the mating plane 306. Additionally, due to imperfections in the manufacturing process or bowing of the PCB 302, the gap 300 may vary across the mating plane 306.

The gap 300 may allow the energy of the operating frequencies radiated by a transmission line 308 and waveguide channel 310 to leak over to a neighboring transmission line 308 and waveguide channel 310, resulting in interference or crosstalk and degrading the sensitivity of the sensor. The isolation slots 312 may prevent or reduce the energy leakage between transmission line 308/waveguide channel 310 pairs by producing a stop band for the desired range of frequencies. The isolation slots 312 may provide adequate isolation (e.g., less than −30 decibels (dB)) even if the gap 300 varies across the mating plane 306. Reducing energy leakage across the radar channels (e.g., transmit channels, receive channels) enables better sensitivity of the radar system and reduces interference.

Example Implementations

Figures 1, 4:
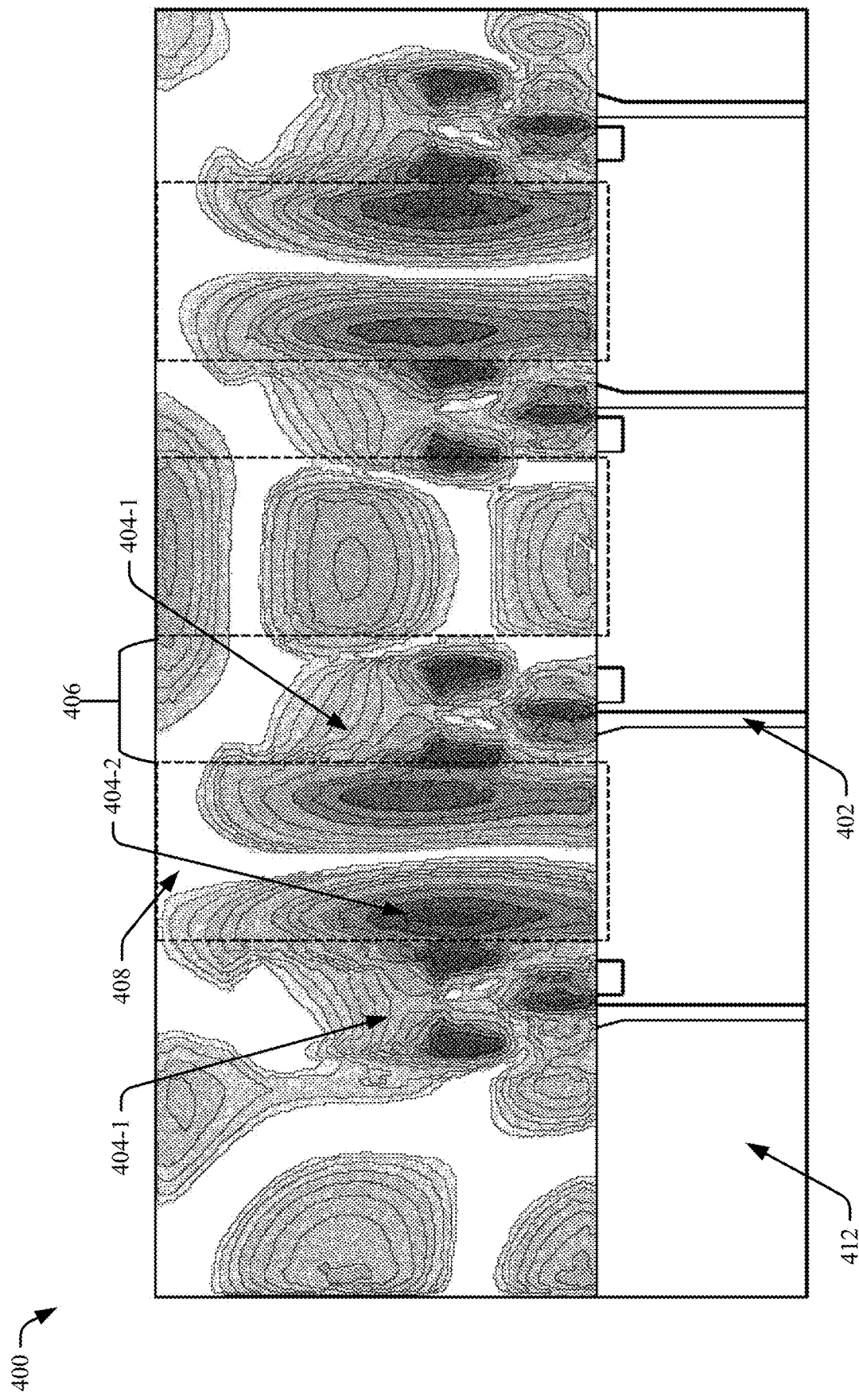
Figures 2, 4:
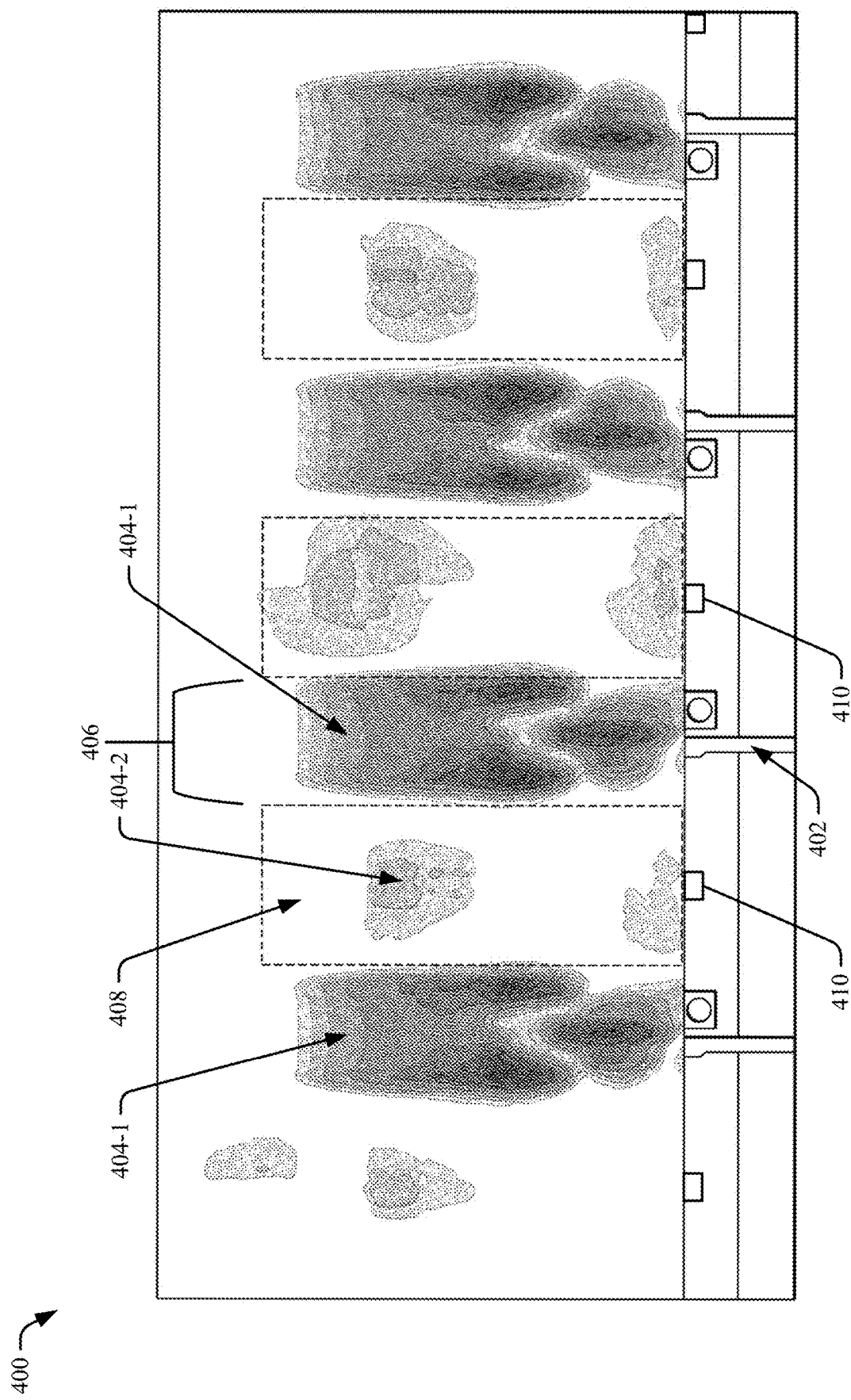

FIGS. 4-1 and 4-2 illustrate an example of the isolation of EM energy in the radar channels of the radar system 102 with isolation slots for an antenna and PCB interface, in accordance with techniques of this disclosure. FIG. 4-1 illustrates the energy leakage in a PCB/antenna structure without isolation slots 410. Transmission line 402 emits EM energy with an electrical field 404-1 through the waveguide channel 406 of the antenna structure 408. Without the isolation slots (e.g., isolation slots 410 illustrated in FIG. 4-2), an unacceptable amount of EM energy, indicated as electrical field 404-2, may leak across the antenna structure 408, due to a gap between the antenna structure 408 and the PCB 412, and into an adjacent waveguide channel 406. However, as illustrated in FIG. 4-2, the isolation slot 410 creates a stop band that prevents most of the energy leakage from occurring as indicated by the weaker electrical field 404-2 in the antenna structure 408. Most of the EM energy is reflected back into the waveguide channel 406.

As an example, an RCM isolation specification may require the less than 30 dB of energy leakage across a frequency band of 75-78 GHz. In a simulation of the radar system 102, the stop band is formed by the isolation slot 410 and nulled at 76.5 GHz, resulting in approximately −35 dB or less of energy leakage across a frequency band of 72-82 GHz. The isolation slots 410 assist in confining the electrical fields 404-1 to the intended waveguide channel 406.

Example Methods

Figure 5:
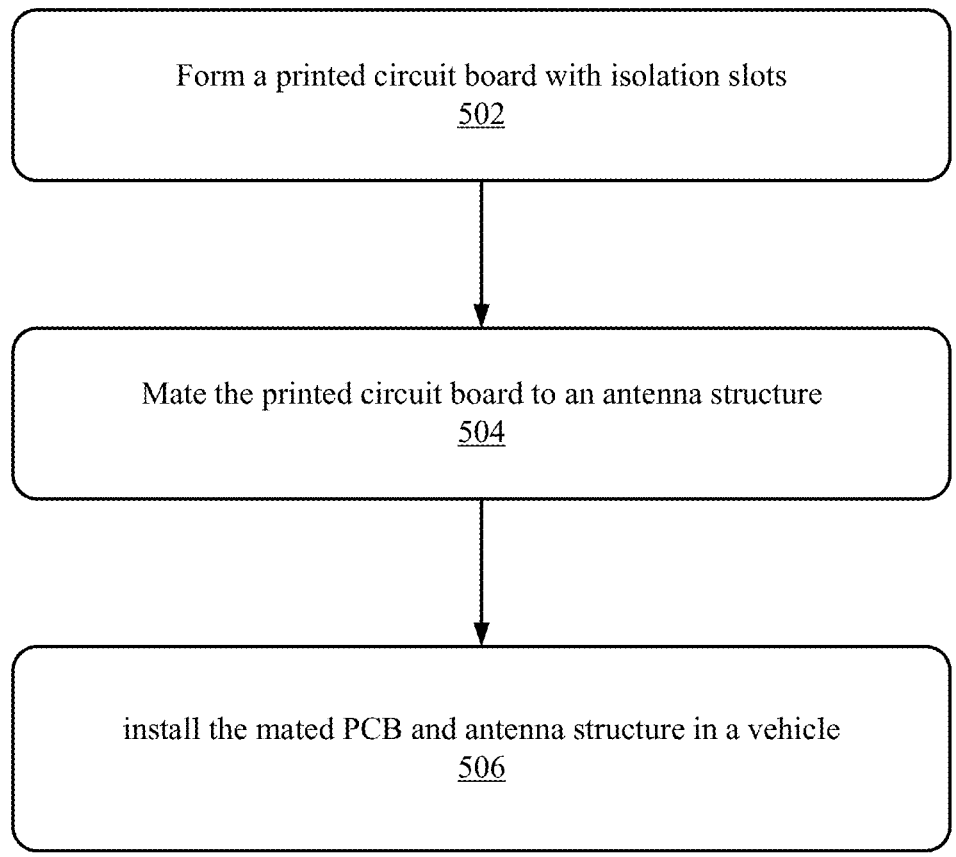
FIG. 5 illustrates an example method of isolation slots for an antenna and PCB interface, in accordance with techniques of this disclosure.

FIG. 5 illustrates an example method 500 of isolation slots for an antenna and PCB interface, in accordance with techniques of this disclosure. Method 500 is shown as sets of operations (or acts) performed, but not necessarily limited to the order or combinations in which the operations are shown herein. Further, any of one or more of the operations may be repeated, combined, or reorganized to provide other methods.

At step 502, a PCB is formed. The PCB includes an array of transmission lines having at least one row of multiple columns, each transmission line configured to transmit or receive electromagnetic energy. The PCB also has a first metal layer, a second metal layer configured as a ground plane, and a dielectric layer disposed between the first metal layer and the second metal layer. The first metal layer includes a waveguide interface opening for surrounding each transmission line in the array of transmission lines. The waveguide interface openings are portions of the first metal layer where the metal has been removed (e.g., etched). The first metal layer also has an isolation slot on each side of each column in the array of transmission lines such that an isolation slot is aligned in the at least one row on each side of each waveguide interface opening. That is, an isolation slot is placed between each transmission line and on each end of the array. Each isolation slot is also a portion of the first metal layer where the metal has been removed. The isolation slots are configured to form a stop band for a frequency band of the EM energy. They isolate the EM energy in each channel that is associated with each transmission line.

At step 504, the PCB is mated to an antenna structure. They may be attached using screws or other fasteners, or by other techniques such as compressed with a radome. The antenna structure includes waveguides that align with each transmission line on the PCB such that when mated, the waveguides radiate EM energy to and from the transmission lines.

At step 506, the mated PCB and antenna structure is installed in a vehicle. In some aspects the PCB is an RCM, and the mated PCB and antenna structure is part of a radar system of the vehicle. The radar system detects and tracks objects in a field-of-view of the vehicle. The radar system may provide information regarding objects in the field-of-view to other systems on the vehicle. For example, the radar system may provide object information to an autonomous driving system, that can use the object information to make driving decisions and avoid a collision with the detected object. Because the isolation slots isolate the EM energy to each channel and reduce energy leakage due to a gap between the PCB and the antenna structure, the radar system may be more sensitive and operate in a more reliable manner.

Additional Examples

Some additional examples for isolation slots for an antenna and PCB interface are provided below.

Example 1: A printed circuit board (PCB) comprising: an array of transmission lines having at least one row of multiple columns, each transmission line configured to transmit or receive electromagnetic energy; and a metal layer comprising: a waveguide interface opening for surrounding each transmission line in the array of transmission lines, each waveguide interface opening being a portion of the metal layer where the metal has been removed; and multiple isolation slots configured to form a stop band for a frequency band of the electromagnetic energy, an isolation slot being disposed on each side of each column in the array of transmission lines such that an isolation slot is aligned in the at least one row on each side of each waveguide interface opening, each isolation slot being a portion of the metal layer where the metal has been removed.

Example 2: The PCB of example 1, wherein each isolation slot comprises: one or more first branches aligned in parallel with a longitudinal direction of the waveguide interface opening; and one or more second branches aligned orthogonal to the longitudinal direction of the waveguide interface opening, wherein each of the one or more second branches is bisected by at least one of the first branches.

Example 3: The PCB of any one of the previous examples, wherein: dimensions of the one or more first branches and dimensions of the one or more second branches are configured to form the stop band; and a quantity and arrangement of the one or more first branches and the one or more second branches are configured to form the stop band.

Example 4: The PCB of any one of the previous examples, wherein the frequency band has a center frequency of 76.5 Gigahertz; and the lengths of the one or more first branches and the one or more second branches are based on a quarter wavelength of the center frequency.

Example 5: The PCB of any one of the previous examples, wherein the frequency band comprises at least a portion of the E-Band or at least a portion of the W-Band.

Example 6: The PCB of any one of the previous examples, wherein: the metal layer is a first metal layer; and the PCB further comprises: a dielectric substrate layer; and a second metal layer configured as a ground plane, wherein the dielectric substrate layer is disposed between the first metal layer and the second metal layer.

Example 7: The PCB of any one of the previous examples, wherein: the array of transmission lines is a first array of transmission lines; and the PCB further comprises: a second array of transmission lines arranged in another array separate from the first array of transmission lines, and the metal layer further comprises: a waveguide interface opening for surrounding each respective transmission line in the second array of transmission lines, each waveguide interface opening being a portion of the metal layer where the metal has been removed; and multiple isolation slots, an isolation slot being disposed on each side of each column in the second array of transmission lines such that an isolation slot is positioned on each side of each waveguide interface opening, each isolation slot being a portion of the metal layer where the metal has been removed.

Example 8: The PCB of any one of the previous examples, wherein the PCB is a radar control module.

Example 9: The PCB of any one of the previous examples, wherein the PCB further comprises a monolithic microwave integrated circuit electrically coupled to each transmission line in the array of transmission lines.

Example 10: The PCB of any one of the previous examples, wherein each transmission line in the array of transmission lines comprises: a microstrip line.

Example 11: The PCB of any one of the previous examples, wherein: the PCB is configured to be mated with an antenna structure; and the isolation slots are configured to block energy leakage, related to an operating frequency of the electromagnetic energy, through a gap formed between the PCB and the antenna structure.

Example 12: A system comprising: an antenna structure including waveguides; and a printed circuit board (PCB) comprising: an array of transmission lines having at least one row of multiple columns, each transmission line configured to transmit or receive electromagnetic energy; and a metal layer comprising: a waveguide interface opening for surrounding each transmission line in the array of transmission lines, each waveguide interface opening being a portion of the metal layer where the metal has been removed; and multiple isolation slots, configured to form a stop band for a frequency band of the electromagnetic energy, an isolation slot being disposed on each side of each column in the array of transmission lines such that an isolation slot is aligned in the at least one row on each side of each waveguide interface opening, each isolation slot being a portion of the metal layer where the metal has been removed.

Example 13: The system of any one of the previous examples, wherein each isolation slot comprises: one or more first branches aligned in parallel with a longitudinal direction of the waveguide interface opening; and one or more second branches aligned orthogonal to the longitudinal direction of the waveguide interface opening, wherein each of the one or more second branches is bisected by at least one of the first branches.

Example 14: The system of any one of the previous examples, wherein: dimensions of the one or more first branches and dimensions of the one or more second branches are configured to form the stop band; and a quantity and arrangement of the one or more first branches and the one or more second branches are configured to form the stop band.

Example 15: The system of any one of the previous examples, wherein the frequency band has a center frequency of 76.5 Gigahertz; and the lengths of the one or more first branches and the one or more second branches are based on a quarter wavelength of the center frequency.

Example 16: The system of any one of the previous examples, wherein the frequency band comprises at least a portion of the E-Band or at least a portion of the W-Band.

Example 17: The system of any one of the previous examples, wherein: the metal layer is a first metal layer; and the PCB further comprises: a dielectric substrate layer; and a second metal layer configured as a ground plane, wherein the dielectric substrate layer is disposed between the first metal layer and the second metal layer.

Example 18: The system of any one of the previous examples, wherein: the array of transmission lines is a first array of transmission lines, and the PCB further comprises: a second array of transmission lines arranged in another array separate from the first array of transmission lines, and the metal layer further comprises: a waveguide interface opening for surrounding each respective transmission line in the second array of transmission lines, each waveguide interface opening being a portion of the metal layer where the metal has been removed; and multiple isolation slots, an isolation slot being disposed on each side of each column in the second array of transmission lines such that an isolation slot is positioned on each side of each waveguide interface opening, each isolation slot being a portion of the metal layer where the metal has been removed.

Example 19: The system of any one of the previous examples, wherein the system is a radar system.

Example 20: A method comprising: forming a printed circuit board (PCB), the PCB comprising: an array of transmission lines having at least one row of multiple columns, each transmission line configured to transmit or receive electromagnetic energy; and a first metal layer comprising: a waveguide interface opening for surrounding each transmission line in the array of transmission lines, each waveguide interface opening being a portion of the metal layer where the metal has been removed; and multiple isolation slots, configured to form a stop band for a frequency band of the electromagnetic energy, an isolation slot being disposed on each side of each column in the array of transmission lines such that an isolation slot is aligned in the at least one row on each side of each waveguide interface opening, each isolation slot being a portion of the metal layer where the metal has been removed; a second metal layer configured as a ground plane; a dielectric substrate layer disposed between the first metal layer and the second metal layer; mating the PCB to an antenna structure; installing the mated PCB and antenna structure in a vehicle to detect and track objects in a field-of-view.

CONCLUSION

While various embodiments of the disclosure are described in the foregoing description and shown in the drawings, it is to be understood that this disclosure is not limited thereto but may be variously embodied to practice within the scope of the following claims. From the foregoing description, it will be apparent that various changes may be made without departing from the spirit and scope of the disclosure as defined by the following claims.

The use of "or" and grammatically related terms indicates non-exclusive alternatives without limitation unless the context clearly dictates otherwise. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

What is claimed is:

1. A printed circuit board (PCB) comprising: an array of transmission lines having at least one row of multiple columns, each transmission line configured to transmit or receive electromagnetic energy; and a metal layer comprising: waveguide interface openings for surrounding each transmission line in the array of transmission lines, each waveguide interface opening being a portion of the metal layer where the metal has been removed; and multiple isolation slots configured to form a stop band for a frequency band of the electromagnetic energy, an isolation slot being disposed on each side of each column in the array of transmission lines such that an isolation slot is aligned in the at least one row on each side of each waveguide interface opening, each isolation slot being a portion of the metal layer where the metal has been removed.

2. The PCB of claim 1, wherein each isolation slot comprises: one or more first branches aligned in parallel with a longitudinal direction of a waveguide interface opening; and one or more second branches aligned orthogonal to the longitudinal direction of a waveguide interface opening, wherein each of the one or more second branches is bisected by at least one of the first branches.

3. The PCB of claim 2, wherein:
   dimensions of the one or more first branches and dimensions of the one or more second branches are configured to form the stop band; and
   a quantity and arrangement of the one or more first branches and the one or more second branches are configured to form the stop band.

4. The PCB of claim 3, wherein:
   the frequency band has a center frequency of 76.5 Gigahertz; and
   lengths of the one or more first branches and the one or more second branches are based on a quarter wavelength of the center frequency.

5. The PCB of claim 1, wherein the frequency band comprises at least a portion of the E-Band or at least a portion of the W-Band.

6. The PCB of claim 1, wherein:
   the metal layer is a first metal layer; and
   the PCB further comprises:
     a dielectric substrate layer; and
     a second metal layer configured as a ground plane, wherein the dielectric substrate layer is disposed between the first metal layer and the second metal layer.

7. The PCB of claim 1, wherein: the array of transmission lines is a first array of transmission lines; and the PCB further comprises: a second array of transmission lines arranged in another array separate from the first array of transmission lines, and the metal layer further comprises: waveguide interface openings for surrounding each respective transmission line in the second array of transmission lines, each waveguide interface opening being a portion of the metal layer where the metal has been removed; and multiple isolation slots, an isolation slot being disposed on each side of each column in the second array of transmission lines such that an isolation slot is positioned on each side of each waveguide interface opening, each isolation slot being a portion of the metal layer where the metal has been removed.

8. The PCB of claim 1, wherein the PCB is a radar control module.

9. The PCB of claim 1, wherein the PCB further comprises a monolithic microwave integrated circuit electrically coupled to each transmission line in the array of transmission lines.

10. The PCB of claim 1, wherein each transmission line in the array of transmission lines comprises:
a microstrip line.

11. The PCB of claim 1, wherein:
the PCB is configured to be mated with an antenna structure; and
the isolation slots are configured to block energy leakage, related to an operating frequency of the electromagnetic energy, through a gap formed between the PCB and the antenna structure.

12. A system comprising: an antenna structure including waveguides; and a printed circuit board (PCB) comprising: an array of transmission lines having at least one row of multiple columns, each transmission line configured to transmit or receive electromagnetic energy; and a metal layer comprising: waveguide interface openings for surrounding each transmission line in the array of transmission lines, each waveguide interface opening being a portion of the metal layer where the metal has been removed; and multiple isolation slots, configured to form a stop band for a frequency band of the electromagnetic energy, an isolation slot being disposed on each side of each column in the array of transmission lines such that an isolation slot is aligned in the at least one row on each side of each waveguide interface opening, each isolation slot being a portion of the metal layer where the metal has been removed.

13. The system of claim 12, wherein each isolation slot comprises: one or more first branches aligned in parallel with a longitudinal direction of a waveguide interface opening; and one or more second branches aligned orthogonal to the longitudinal direction of a waveguide interface opening, wherein each of the one or more second branches is bisected by at least one of the first branches.

14. The system of claim 13, wherein:
dimensions of the one or more first branches and dimensions of the one or more second branches are configured to form the stop band; and
a quantity and arrangement of the one or more first branches and the one or more second branches are configured to form the stop band.

15. The system of claim 14, wherein:
the frequency band has a center frequency of 76.5 Gigahertz; and
lengths of the one or more first branches and the one or more second branches are based on a quarter wavelength of the center frequency.

16. The system of claim 12, wherein the frequency band comprises at least a portion of the E-Band or at least a portion of the W-Band.

17. The system of claim 12, wherein:
the metal layer is a first metal layer; and
the PCB further comprises:
a dielectric substrate layer; and
a second metal layer configured as a ground plane, wherein the dielectric substrate layer is disposed between the first metal layer and the second metal layer.

18. The system of claim 12, wherein: the array of transmission lines is a first array of transmission lines, and the PCB further comprises: a second array of transmission lines arranged in another array separate from the first array of transmission lines, and the metal layer further comprises: waveguide interface openings for surrounding each respective transmission line in the second array of transmission lines, each waveguide interface opening being a portion of the metal layer where the metal has been removed; and multiple isolation slots, an isolation slot being disposed on each side of each column in the second array of transmission lines such that an isolation slot is positioned on each side of each waveguide interface opening, each isolation slot being a portion of the metal layer where the metal has been removed.

19. The system of claim 12, wherein the system is a radar system.

20. A method comprising: forming a printed circuit board (PCB), the PCB comprising: an array of transmission lines having at least one row of multiple columns, each transmission line configured to transmit or receive electromagnetic energy; and a first metal layer comprising: waveguide interface openings for surrounding each transmission line in the array of transmission lines, each waveguide interface opening being a portion of the metal layer where the metal has been removed; and multiple isolation slots, configured to form a stop band for a frequency band of the electromagnetic energy, an isolation slot being disposed on each side of each column in the array of transmission lines such that an isolation slot is aligned in the at least one row on each side of each waveguide interface opening, each isolation slot being a portion of the metal layer where the metal has been removed; a second metal layer configured as a ground plane; a dielectric substrate layer disposed between the first metal layer and the second metal layer; mating the PCB to an antenna structure; and installing the mated PCB and antenna structure in a vehicle to detect and track objects in a field-of-view.

* * * * *